(12) United States Patent
Lnu

(10) Patent No.: US 9,112,511 B2
(45) Date of Patent: Aug. 18, 2015

(54) LOW VOLTAGE LEVEL SHIFTER FOR LOW POWER APPLICATIONS

(71) Applicant: Synopsys, Inc., Mountain View, CA (US)

(72) Inventor: Basannagouda Lnu, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/787,598

(22) Filed: Mar. 6, 2013

(65) Prior Publication Data

US 2014/0253211 A1 Sep. 11, 2014

(51) Int. Cl.
*H03L 5/00* (2006.01)
*H03K 3/012* (2006.01)
*H03K 3/356* (2006.01)

(52) U.S. Cl.
CPC ............ *H03L 5/00* (2013.01); *H03K 3/356182* (2013.01)

(58) Field of Classification Search
CPC .................................. H03K 3/012; H03L 5/00
USPC ........... 326/62–63, 80–81; 327/303, 333, 306
See application file for complete search history.

(56) References Cited

U.S. PATENT DOCUMENTS

| | | | |
|---|---|---|---|
| 6,380,570 B1 * | 4/2002 | Voldman | 257/288 |
| 6,518,816 B2 * | 2/2003 | Riccio et al. | 327/333 |
| 7,468,615 B1 * | 12/2008 | Tan et al. | 326/68 |
| 2008/0111609 A1 * | 5/2008 | Shen | 327/333 |

* cited by examiner

*Primary Examiner* — Dinh Le
(74) *Attorney, Agent, or Firm* — Fenwick & West LLP

(57) ABSTRACT

A level shifter circuit for low power applications that can shift the level of a digital signal that is below the threshold voltage of output transistors. The level shifter uses core transistors in the input stage and includes an intermediate stage that limits the voltage applied to the drain of the core transistors. The intermediate stage may include two transistors whose gate is connected to a reference voltage and turns off when the voltage at their source is equal to a threshold voltage below the reference voltage, thus limiting the maximum voltage applied to the transistors present in the input stage.

21 Claims, 4 Drawing Sheets

US 9,112,511 B2

LOW VOLTAGE LEVEL SHIFTER FOR LOW POWER APPLICATIONS

BACKGROUND OF THE INVENTION

1. Field of the Disclosure

The present disclosure relates to level shifters and more specifically to low voltage level shifters.

2. Description of the Related Art

Different logic blocks inside an integrated circuit can function using different supply voltages. For instance, a core logic block can use a low voltage power supply (Vdd) to reduce power consumption, while an input/output (I/O) logic block can use a high voltage power supply (Vdde) to communicate to components outside of the integrated circuit. A level shifter is used to interface two logic blocks operating with different voltage power supplies.

In order for a level shifter to operate, the active voltage level of the input signal has to be greater than the threshold voltage of the switching devices (e.g., transistors) receiving the input signal. If the active voltage level of the input signal is not greater than the threshold voltage, the switching devices receiving the input signal are not turned on, despite the active logic state of the input signal. As power consumption in integrated circuits becomes increasingly important, attempts are being made to lower the supply voltage of core components.

Such decrease in supply voltage may also lower the level of input signal and cause switching devices to turn off even when the input signal is in an active logic state.

SUMMARY

Embodiments relate to a level shifter includes an intermediate stage between an input stage operable to receive an input signal in a first range and an output stage generating an output signal changing in a second voltage range higher than the first voltage range. The intermediate stage regulates an intermediate signal in response to the operation of the input stage. The output signal of the output stage is generated based on the intermediate stage.

In one or more embodiments, the intermediate stage includes a first intermediate stage transistor and a second intermediate stage transistor. The source of the first intermediate stage transistor is coupled to the drain of a first input stage transistor. The drain of the first intermediate stage transistor is coupled to the drain of the first output stage transistor. The source of the second intermediate stage transistor coupled to the drain of a second input stage transistor. The drain of the second intermediate stage transistor coupled to the drain of the second output stage transistor.

In one or more embodiments, the first intermediate stage transistor turns on to discharge a first output node responsive to the operation of the first input stage transistor and regulates the voltage of a first intermediate signal. The second intermediate stage transistor turns on to discharge a second output node responsive to the operation of the second input stage transistor and regulates the voltage of a second intermediate signal.

In one or more embodiments, the first intermediate signal and the second intermediate signal are the voltages at the drain of the first input stage transistor and the drain of the second input stage transistor.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a level shifter circuit that can be used for low power application. The level shifter circuit of the disclosed invention can operate with an input signal switching at a voltage level below the threshold voltage of I/O transistors. Core transistors that switch at lower voltage levels compared to I/O transistors are used in the input stage. To protect the core transistors in the input stage by limiting the voltage applied to the core transistors in the input stage, an intermediate stage is included in the level shifter to regulate the voltage applied to the drain of the core transistors in the input stage.

A level shifter described herein refers to a circuit element that can receive an input signal from a logic block switching at a first voltage level (e.g. between ground GND and input logic block supply voltage Vdd) and produce an output signal switching at a second voltage level (e.g. ground GND and output logic block supply voltage Vdde) in accordance with the switching of the input signal.

Figure 1:
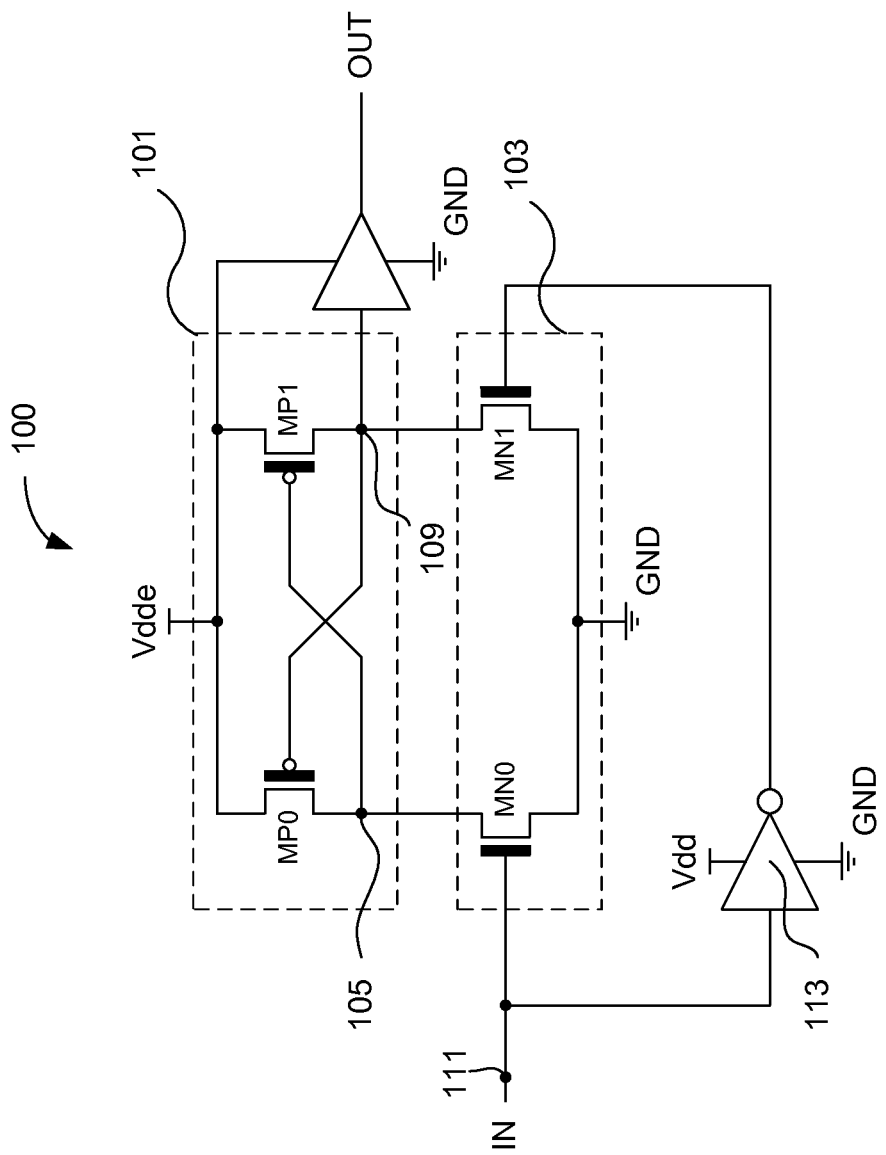
FIG. 1 is a circuit diagram of a level shifter, according to one embodiment.

FIG. 1 is a circuit diagram illustrating a level shifter 100. The level shifter 100 receives an input signal IN in an input voltage range, and produces an output signal OUT in an output voltage range higher than the input voltage range. The level shifter 100 is comprised of an input stage 103 and an output stage 101.

The input stage 103 receives the input signal IN and pulls down the voltage of one of the output nodes 105, 109 to ground GND depending on whether the input signal IN is active or inactive. If the input signal IN is active, the input stage pulls down node 105. If the input signal IN is inactive, the input stage pulls down node 109. The input stage 103 includes two n-channel field effect transistors (FET) MN0, MN1. The input signal IN is then provided to FET MN0 and the inverted version of the input signal $\overline{IN}$ is provided to FET MN1 (the inverted input signal $\overline{IN}$ is generated by inverter 113 also receiving the input signal IN).

The output stage 101 pulls up the voltage of one of the output nodes 105, 109 to the supply voltage Vdde of a logic block coupled to the output of the level shifter when one of the output nodes is pulled down to ground GND by the input stage 103. If the voltage of node 105 is pulled down to ground GND (when input signal IN is active), the output stage 101 pulls up the voltage of node 109. If node 109 is pulled down to ground GND (when inputs signal IN is inactive), the output stage pulls up the voltage of node 105. The output stage comprises two p-channel FETs MP0, MP1.

In one embodiment, the FETs used to construct the level shifter are the FETs used in the output logic block (I/O FETs) of the level shifter. I/O FETs are designed to work with the output logic block's supply voltage Vdde and therefore are more effective at switching the output node at the second voltage level (e.g. ground GND to output logic block supply voltage Vdde).

The drain of FET MP0 is coupled to the drain of FET MN0. The drain of FET MP1 is coupled to the drain of FET MN1. Furthermore, the gate of FET MP0 is connected to the node 109 connecting the drain of FET MP1 and the drain of FET MN1; and the gate of FET MP1 is connected to the node 105 connecting the drain of FET MP0 and the drain of FET MN0. The source of FET MP0 and FET MP1 are coupled to the supply voltage of the output logic block Vdde and the source of FET MN0 and FET MN1 are coupled to ground GND.

In order for the level shifter of FIG. 1 to operate, the voltage level of the active signal ($V_{high}$), which is usually equal to the supply voltage Vdd of the logic block coupled to the input of the level shifter, has to be greater than the threshold voltage ($Vt_{IO}$) of the of the input stage FETs MN0, MN1. If $V_{high}$ is lower than $Vt_{IO}$, then the input stage FETs will not be able to turn on and therefore neither node 105 nor node 109 will be able to be pulled down to ground GND.

In one embodiment, the FETs used in the input stage 103 of the level shifter 100 are the FETs used in the logic block coupled to the input of the level shifter (core FETs). Core FETs are designed to work with a lower supply voltage, and therefore, core FETs can switch at lower voltages than I/O FETs. Accordingly, core FETs will have a smaller threshold voltage ($Vt_{core}$) and will be more effective at pulling down the output nodes for very low input voltages. In one embodiment, core FETs are characterized by a smaller gate oxide thickness (e.g., 25 Å) compared to I/O FETs (e.g., 60 Å).

One of many concerns in using core FETs instead of I/O FETS in a level shifter is their reliability. A core FET is designed to work at a lower voltage level and may not withstand a large voltage difference applied between its drain and source. During the operation of the level shifter 100, as one of the output nodes 105, 109 is pulled up to the supply voltage Vdde of the output logic block, the drain voltage of the corresponding input stage FET will also start increasing. If the drain to source voltage of either FET MN0 or FET MN1 surpasses their drain to source voltage rating ($Vdsmax_{core}$), the core FET experiencing the large voltage tends to break down, creating a discharge path for the node 105, 109 being pulled up. As a result, the level shifter will not be able to produce an output indicative of an active or inactive state in a predefined voltage range.

Figure 2:
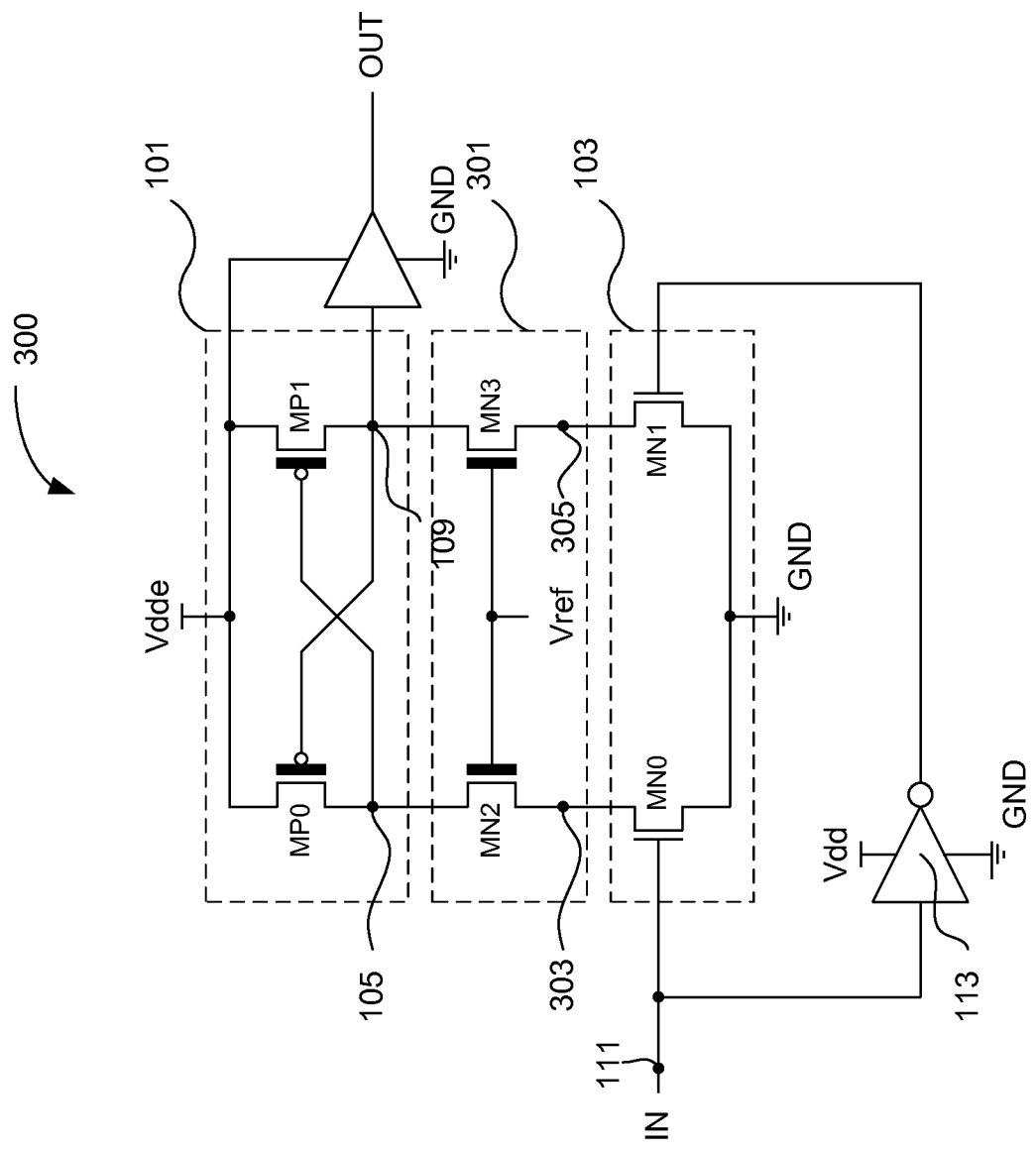
FIG. 2 is a circuit diagram of a level shifter, according to one embodiment.

FIG. 2 is a circuit diagram of a level shifter 300, according to one embodiment. The level shifter 300 includes an intermediate stage 301 between an input stage 103 and an output stage 101. The intermediate 301 stage limits or regulates the voltage applied to the input stage 103 and discharges one of the output nodes 105, 109 responsive to the operation of the input stage 103.

The input stage 103 receives the input signal IN and pulls down the voltage of one of the output nodes 105, 109 to ground GND depending on whether the input signal IN is active or inactive. If the input signal IN is active, the input stage pulls down node 105. If the input signal IN is inactive, the input stage pulls down node 109. The input stage 103 includes two n-channel FETs MN0, MN1. The input signal IN is then provided to FET MN0 and the inverted version of the input signal $\overline{IN}$ is provided to FET MN1 (the inverted input signal $\overline{IN}$ is generated by inverter 113 also receiving the input signal IN). Furthermore, the source of FET MN0 and FET MN1 are coupled to ground GND.

The output stage 101 pulls up the voltage of one of the output nodes 105, 109 to the supply voltage Vdde of the output logic block when one of the output nodes is pulled down to ground GND by the input stage 103. If the voltage of node 105 is pulled down to ground GND (when input signal IN is active), the output stage 101 pulls up the voltage of node 109. If node 109 is pulled down to ground GND (when inputs signal IN is inactive), the output stage pulls up the voltage node 105. The output stage comprises two p-channel FETs MP0, MP1. The gate of MP0 is connected to the drain of MP1, and the gate of MP1 is connected to the drain of MP0. In addition, the source of MP0 and MP1 are coupled to the supply voltage of the output logic block Vdde.

The intermediate stage 301 of the level shifter 300 may include, among other components, two n-channel I/O FETs MN2, MN3. The drain of FET MN2 is connected to the drain of FET MP0 and the source of FET MN2 is coupled to the drain of FET MN0. The drain of FET MN3 is connected to the drain of FET MP1 and the source of FET MN3 is coupled to the drain of FET MN1. Furthermore, the gates of FETs MN2 and MN3 are connected to a reference voltage (Vref).

If the input signal IN is active, FET MN0 turns on, discharging the node 303 connecting the drain of FET MN0 and the source of FET MN2. As node 303 discharges, the drain to source voltage of FET MN2 (Vref minus voltage at node 303) starts increasing. As the drain to source voltage of FET MN2 increases, FET MN2 starts turning on, creating a discharge path for the node 105 connecting the drain of FET MP0 and the drain of FET MN2. As a result, node 105 also discharges to ground GND. As node 105 discharges to ground GND, FET MP1 turns on creating a charging path for the node 109 connecting the drain of FET MP1 and the drain of FET MN3. Depending on the voltage level of the node 305 connecting the source of FET MN3 and the drain of FET MN1, FET MN3 can be turned on or off. If FET MN3 is turned on, FET MN3 creates a charging path for node 305 until the voltage between the gate and source of FET MN3 is below the threshold voltage $Vt_{IO}$ of FET MN3. When the gate to source voltage of FET MN3 reaches $Vt_{IO}$, FET MN3 turns off, removing the charging path for node 305. Therefore, node 305 will only charge up to (Vref–$Vt_{IO}$).

If the input signal IN is inactive, FET MN1 turns on, discharging node 305. As node 305 discharges, FET MN3 turns on, creating a discharge path for node 109. As node 109 discharges, FET MP0 turns on, creating a charging path for 105. If the gate to source voltage of FET MN2 is greater than the threshold voltage $Vt_{IO}$ of FET MN2, node 303 charges until the gate to source voltage of FET MN2 reaches a voltage of (Vref–$Vt_{IO}$). As a result, the drain to source voltage of FETs MN0 and MN1 does not increase beyond (Vref–$Vt_{IO}$).

In some embodiments, the supply voltage Vdd of the logic block couple to the input of the level shifter can be used as the reference voltage (i.e. Vref=Vdd). In other embodiments, the supply voltage of the output logic block Vdde can be used as the reference voltage (i.e. Vref=Vdde). In yet other embodiments, a third supply voltage different from Vdd and Vdde may be used as the reference voltage. If reference voltage Vref is equal to Vdd, FETs MN2, MN3 will only turn on if Vdd is higher than $Vt_{IO}$. If Vref is equal to Vdde, the disclosed topology will ensure that the drain to source voltage of FETs MN0 and MN1 is not stressed beyond $Vdsmax_{core}$ as long as (Vdde–$Vt_{IO}$) is less than or equal to $Vdsmax_{core}$. In one embodiment, the voltage for Vref for the circuit diagram of FIG. 2 may be higher than $Vt_{IO}$ and lower than $Vt_{IO}$+Vds- $\max_{core}$. In this embodiment, Vref is equal to Vdd plus the threshold voltage of the core FETs (Vdd+$Vt_{core}$).

If a voltage source is unavailable to supply a voltage of (Vdd+$Vt_{core}$) or any voltage between $Vt_{IO}$ and ($Vt_{IO}$+$Vdsmax_{core}$), an additional circuit may provide Vref of a desired voltage level. However, providing a separate circuit to set Vref to the desired voltage level can be expensive in terms of area and power consumption. For example, if a voltage divider is used to set Vref, the resistors used to construct the voltage divider will constantly be consuming power and the voltage divider will occupy a large area of the level shifter's floor plan.

Figure 3:
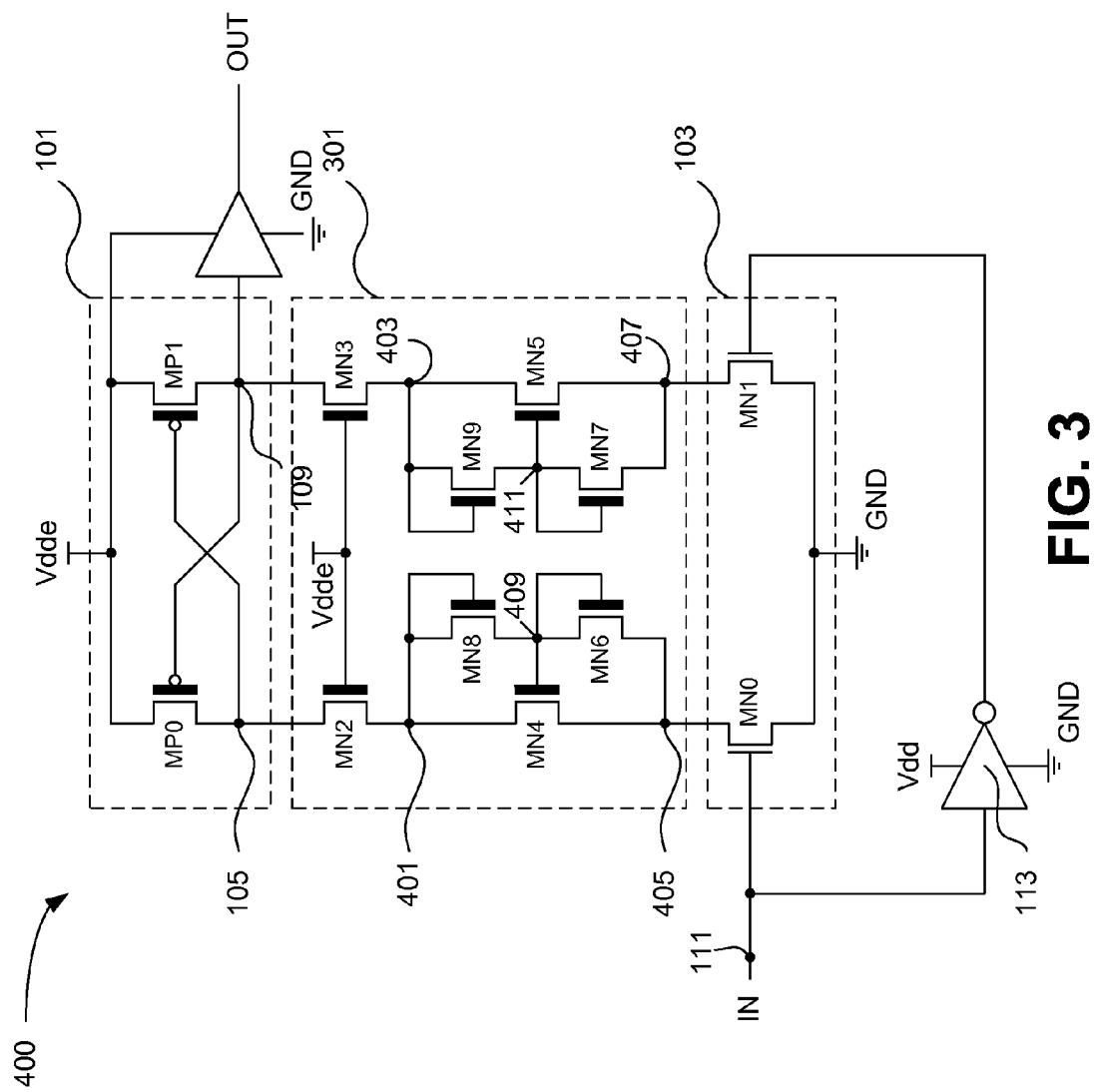
FIG. 3 is a circuit diagram of a level shifter for low power applications, according to another embodiment.

FIG. 3 illustrates a level shifter 400 for low power applications, according to another embodiment. The level shifter 400 includes an intermediate stage 301 between an input stage 103 and an output stage 101. The intermediate stage 301 limits or regulates the voltage applied to the input stage 103 and discharges one of the output nodes 105, 109 responsive to the operation of the input stage 103. The operation and the structure of input stage and output stage in level shifter 400 is substantially the same as those of the input stage and output stage in level shifter 300, and therefore, detailed description of the input stage in level shifter 400 is omitted herein.

The intermediate stage 301 of the level shifter 300 may include, among other components, two n-channel I/O FETs MN2, MN3. The drain of FET MN2 is connected to the drain of FET MP0 and the drain of FET MN3 is connected to the drain of FET MP1. Furthermore, the gates of FETs MN2 and MN3 are connected to the supply voltage Vdde of the output logic block. Furthermore, an additional n-channel I/O FET MN4 is included between the source of FET MN2 and the drain of FET MN0, and another n-channel I/O FET MN5 between the source of FET MN3 and the drain of FET MN1.

In order to set the gate voltage of FETs MN4 and MN5, each of these FETs have a voltage divider that divides their drain to source voltage. In one embodiment, the voltage dividers are configured to divide the voltage in half. In other embodiments, a different ratio (e.g. 1/3 or 1/4) is used depending on the values of the supply voltage Vdd of the input logic block, the supply voltage Vdde of the output logic block, maximum drain to source voltage for core FETs $Vdsmax_{core}$ and the threshold voltage of I/O FETs $Vt_{IO}$. In some embodiments, the voltage divider comprises two diode connected n-channel I/O FETs and the ratio of the voltage divider is dependent on the ratio between their channel widths and/or channel lengths. In one embodiment, FETs MN6, MN7, MN8 and MN9 comprises one or more FETs connected in series and the ratio of the voltage dividers are dependent on the ratio between the number of FETs connected in series. In other embodiments, two multi-finger n-channel I/O FETs, or two sets of parallel connected n-channel I/O FETs are used to construct the voltage divider and the ratio of the voltage divider is equal to the ratio of fingers between the multi-finger n-channel I/O FETs or the ratio of the number of FETs in parallel between each set of parallel connected n-channel I/O FETs.

If the input signal IN is active, FET MN0 turns on, creating a discharging path for the node 405 connecting the drain of FET MN0 and the source of FET MN4. As node 405 discharges to ground GND, FET MN4 turns on, creating a discharge path for the node 401 connecting the drain of FET MN4 and the source of FET MN2. Node 401 will keep discharging until the gate to source voltage of FET MN4 is equal to $Vt_{IO}$. For example, if the voltage divider of FET MN4 divides the drain to source voltage of FET MN4 in half, FET MN4 will keep discharging node 401 until the voltage at node 401 is equal to $2Vt_{IO}$. As node 401 discharges, FET MN2 also turns on, creating a discharge path for node 105. As node 105 discharges, FET MP1 turns on creating a charging path for node 109. In this way, an output signal OUT of active state is produced by the level shifter 400.

Since the gate of FET MN3 is connected to the supply voltage Vdde of the output logic block, FET MN3 is turned on as node 109 charges, creating a charging path for node 403 connecting the source of FET MN3 and the drain of FET MN5. Node 403 will continue to charge until the gate to source voltage of FET MN3 is equal to $Vt_{IO}$ (i.e., the voltage at node 403 is equal to (Vdde–$Vt_{IO}$)). As node 403 charges, FET MN5 turns on, creating a charging path for the node 407 connecting the drain of FET MN1 and the source of FET MN5. Node 407 will continue to charge until the gate to source voltage of FET MN5 drops down to $Vt_{IO}$. If the ratio between the output voltage of the voltage divider of FET MN5 and the input voltage of the voltage divider of MN5 is 1/R, when FET MN5 turns off, the voltage at the drain of FET MN1 will be approximately equal to (Vdde–(1+R)$Vt_{IO}$).

The level shifter 400 of FIG. 3 operates in a similar manner when the input signal IN is inactive. Charge at node 109 is discharged through FETs MN3, MN5 and MN1, causing the output signal OUT to drop to an inactive state. Similar to the behavior when IN is active, the voltage at the drain of FET MN0 does not increase beyond (Vdde–(1+R)$Vt_{IO}$). As a result, the ratio of the voltage divider can be chosen to ensure (Vdde–(1+R)$Vt_{IO}$) is less than the maximum voltage $Vdsmax_{core}$ that can be applied at the drain of core FETs.

Thus, the maximum voltage applied at the drain of FET MN0 or FET MN1 can be set by changing the ratio of the voltage divider during the design of the level shifter 400. In some embodiments, multiples n-channel I/O FETs, biased using a voltage divider, are placed in series to further reduce the maximum voltage applied at the drain of the input stage FETs.

In some embodiments, the input stage is constructed using p-channel core FETs, the intermediate stage is constructed using p-channel I/O FETs and the output stage is constructed using n-channel I/O FETs. In some embodiments, metal-oxide-semiconductor field-effect-transistors (MOSFETs) are used to construct the level shifter. In other embodiments, other types of transistors, such as Tri-Gate FETs, FinFETs, SOI MOSFETs and the like may be used to construct the level shifter. In some embodiments bipolar transistors (e.g., bipolar junction transistors or BJTs) are used to construct the level shifter. In other embodiments, a hybrid technology (e.g., BiC-MOS) may be used to construct the level shifter.

Figure 4:
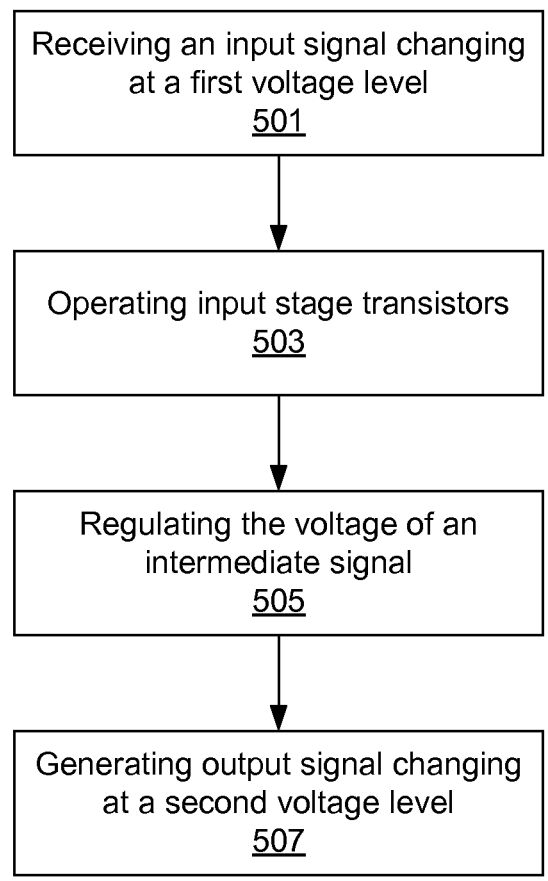
FIG. 4 is a flowchart illustrating a method of operating a level shifter, according to one embodiment.

FIG. 4 is a flowchart illustrating a method of operating a level shifter, according to one embodiment. The level shifter receives 501 an input signal IN changing at a first voltage level. In some embodiments, the input signal IN is an output of a core logic block designed to operate at low voltages. The input signal operates 503 a first transistor MN0 of the input stage 103 and the inverse of the input signal operates 503 a second transistor MN1 of the input stage 103.

The level shifter regulates 505 the voltage of an intermediate signal. In some embodiments, the intermediate signal corresponds to a voltage at the drain of MN0 if the input signal IN is inactive, or a voltage at the drain of the second transistor MN1 if the input signal IN is active. In some embodiments, the regulation of the voltage of the intermediate signal is performed by operating a third transistor MN2 based on a reference voltage and the voltage at the drain of the first transistor MN0; and/or by operating a fourth transistor MN3 based on the reference voltage and the voltage at the drain of the second transistor MN1.

The level shifter generates 507 an output signal OUT changing at a second voltage level based on the intermediate signal. The output signal OUT corresponds to the logic state of the input signal. In some embodiments, the voltage level of the output signal OUT is higher than the voltage level of the input signal IN. In some embodiments, the output stage generates 507 the output signal by operating a fifth transistor MP0 and a sixth transistor MP1.

In some embodiments, the intermediate stage regulates 505 the intermediate signal corresponding to the voltage at the drain of MN0 by operating a seventh transistor MN4 biased using a first voltage divider dividing the drain to source voltage of the seventh transistor MN4, and regulates 505 the intermediate signal corresponding to the voltage at the drain of the second transistor MN1 by operating an eighth transistor MN5 biased using a second voltage divider dividing the drain to source voltage of the eighth transistor MN5.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A non-transitory computer readable medium storing a digital representation of level shifter circuit, the level shifter circuit comprising:
   an input stage configured to receive an input signal from an input terminal changing in a first voltage range, and comprising:
     a first transistor having a gate receiving the input signal, the first transistor turned on responsive to the input signal being active and turned off responsive to the input signal being inactive, and
     a second transistor having a gate receiving an inverse of the input signal, the second transistor turned on responsive to the input signal being inactive and turned off responsive to the input signal being active;
   an intermediate stage coupled to the input stage and configured to regulate a voltage of an intermediate signal generated in response to operation of the input stage, the intermediate stage comprising:
     a third transistor having a gate receiving a reference voltage and a source coupled to a drain of the first transistor,
     a fourth transistor having a gate receiving the reference voltage and a source coupled to a drain of the second transistor,
     a fifth transistor coupled to the third transistor,
     a first voltage divider configured to bias the fifth transistor by dividing a voltage between a drain of the fifth transistor and a source of the fifth transistor, an output of the first voltage divider coupled to a gate of the fifth transistor,
     an sixth transistor coupled to the forth transistor, and
     a second voltage divider configured to bias the sixth transistor by dividing a voltage between a drain of the sixth transistor and a source of the sixth transistor, an output of the second voltage divider coupled to a gate of the sixth transistor,
     wherein a threshold voltage of the fifth transistor and the sixth transistor is larger than first voltage range; and
   an output stage coupled to the intermediate stage, the output stage configured to generate an output signal changing at a second voltage range higher than the first voltage range based on the intermediate signal.

2. A level shifter circuit comprising:
   an input stage configured to receive an input signal from an input terminal changing in a first voltage range, and comprising:
     a first transistor having a gate receiving the input signal, the first transistor turned on or off responsive to the input signal, and
     a second transistor having a gate receiving an inverse of the input signal, the second transistor turned on or off responsive to the inverse of the input signal;
   an intermediate stage coupled to the input stage and configured to regulate a voltage of an intermediate signal generated in response to operation of the input stage, the intermediate stage comprising:
     a third transistor having a gate receiving a reference voltage and a source coupled to a drain of the first transistor,
     a fourth transistor having a gate receiving the reference voltage and a source coupled to a drain of the second transistor,
     a fifth transistor coupled to the third transistor,
     a first voltage divider configured to bias the fifth transistor by dividing a voltage between a drain of the fifth transistor and a source of the fifth transistor, an output of the first voltage divider coupled to a gate of the fifth transistor,
     an sixth transistor coupled to the forth transistor, and
     a second voltage divider configured to bias the sixth transistor by dividing a voltage between a drain of the sixth transistor and a source of the sixth transistor, an output of the second voltage divider coupled to a gate of the sixth transistor; and
   an output stage coupled to the intermediate stage, the output stage configured to generate an output signal changing at a second voltage range higher than the first voltage range based on the intermediate signal.

3. The level shifter circuit of claim 2, wherein:
   the first voltage divider comprises:
     a ninth transistor having a drain coupled to the drain of the fifth transistor, and a source coupled to the gate of the fifth transistor, and
     a tenth transistor having a drain coupled to the source of the ninth transistor and a source coupled to the source of the fifth transistor; and
   the second voltage divider comprises:
     an eleventh transistor having a drain coupled to the drain of the sixth transistor, and a source of coupled to the gate of the sixth transistor; and
     a twelfth transistor having a drain coupled to the source of the eleventh transistor, and a source coupled to the source of the sixth transistor.

4. The level shifter circuit of claim 2, wherein the output stage comprises:
   a seventh transistor having a drain coupled to a drain of the third transistor; and
   an eighth transistor having a drain coupled to a drain of the fourth transistor, a gate of the seventh transistor coupled to the drain of the eighth transistor, and the drain of the seventh transistor coupled to a gate of the eighth transistor, the eighth transistor turns on responsive to the drain of the seventh transistor being discharged, and the seventh transistor turns on responsive to the drain of the eighth transistor being discharged.

5. The level shifter circuit of claim 4, wherein the first transistor, the second transistor, the third transistor and the forth transistors are n-type field effect transistors, and the seventh transistor and the eighth transistor are p-type field effect transistors.

6. The level shifter of claim 4, wherein a source of the first transistor and a source of the second transistor are coupled to a first supply voltage, and a source of the seventh transistor and a source of the eighth transistor are coupled to a second supply voltage.

7. The level shifter circuit of claim 6, wherein the reference voltage is the second supply voltage.

8. The level shifter of claim 2, further comprising:
an output buffer, the output buffer configured to buffer the output signal, an input of the output buffer coupled to an output of the output stage.

9. The level shifter circuit of claim 2, wherein the third transistor and the forth transistor have a threshold voltage larger than a threshold voltage of the first transistor and the second transistor.

10. The level shifter circuit of claim 9, wherein the third transistor and the forth transistor have a gate oxide thicker than a gate oxide of the first transistor and the second transistor.

11. A method, comprising:
controlling a first transistor of an input stage of a level shifter responsive to receiving an input signal, changing at a first voltage range, from an input terminal at a gate of the first transistor;
controlling a second transistor of the input stage responsive to receiving an inverse of the input signal at a gate of the second transistor;
regulating an intermediate voltage generated at an intermediate stage, the intermediate stage coupled between the input stage and an output stage, by:
controlling a third transistor using a reference voltage and a drain voltage the first transistor,
controlling a fourth transistor using the reference voltage and a drain voltage of the second transistor,
controlling a gate of a fifth transistor using a first voltage divider, the first voltage divider configured to divide a voltage between a source of the third transistor and a drain of the first transistor, a drain of the fifth transistor coupled to the source of the third transistor and a source of the fifth transistor coupled to the drain of the first transistor; and
controlling a gate of an sixth transistor using a second voltage divider, the second voltage divider configured to divide a voltage between a source of the fourth transistor and a drain of the second transistor, a drain of the sixth transistor coupled to the source of the fourth transistor, and a source of the sixth transistor coupled to the drain of the second transistor; and
generating, at the output stage, an output signal changing at a second voltage range higher than the first voltage range, the output signal corresponding to an active state or an inactive state of the input signal responsive to controlling the first transistor and the second transistor.

12. The method of claim 11, wherein:
controlling the gate of the fifth transistor using the first voltage divider comprises:
controlling a ninth transistor having a drain coupled to the drain of the fifth transistor, and a source coupled to the gate of the fifth transistor, and
controlling a tenth transistor having a drain coupled to the source of the ninth transistor and a source coupled to the source of the fifth transistor; and
controlling the gate of the sixth transistor using the second voltage divider comprises:
controlling an eleventh transistor having a drain coupled to the drain of the sixth transistor, and a source coupled to the gate of the sixth transistor; and
controlling a twelfth transistor having a drain coupled to the source of the eleventh transistor, and a source coupled to the source of the sixth transistor.

13. The method of claim 11, wherein generating, at the output stage, an output signal changing at a second voltage range higher than the first voltage range and corresponding to an active state or an inactive state of the input signal responsive to the operation of the first transistor and the second transistor comprises:
controlling a seventh transistor having a drain coupled to a drain of the third transistor; and
controlling an eighth transistor having a drain coupled to a drain of the fourth transistor, a gate of the seventh transistor coupled to the drain of the eighth transistor, and the drain of the seventh transistor coupled to a gate of the eighth transistor, the eighth transistor turns on responsive to the drain of the seventh transistor being discharged, and the seventh transistor turns on responsive to the drain of the eighth transistor being discharged.

14. The method of claim 13, wherein the first transistor, the second transistor, the third transistor and the forth transistors are n-type field effect transistors, and the seventh transistor and the eighth transistor are p-type field effect transistors.

15. The method of claim 13, wherein a source of the first transistor and a source of the second transistor are coupled to a first supply voltage, and a source of the seventh transistor and a source of the eighth transistor are coupled to a second supply voltage.

16. The method of claim 15, wherein the reference voltage is the second supply voltage.

17. The method of claim 11, further comprising buffering the output signal by an output buffer.

18. The method of claim 11, wherein the third transistor and the forth transistor have a threshold voltage larger than a threshold voltage of the first transistor and the second transistor.

19. The method of claim 18, wherein the third transistor and the forth transistor have a gate oxide thicker than a gate oxide of the first transistor and the second transistor.

20. The level shifter circuit of claim 2 wherein a threshold voltage of the fifth transistor and a threshold voltage of the sixth transistor is larger than the first voltage range.

21. The level shifter circuit of claim 2 wherein a drain to source voltage rating of the first transistor and the drain to source voltage rating of the second transistor is smaller than the second voltage range.

* * * * *